United States Patent
Mohamed et al.

(10) Patent No.: US 8,642,394 B2
(45) Date of Patent: Feb. 4, 2014

(54) METHOD OF MANUFACTURING ELECTRONIC DEVICE ON LEADFRAME

(75) Inventors: Abdul Rahman Mohamed, Johor (MY); Stanley Job Doraisamy, Kuala Lumpur (MY); Tien Lai Tan, Melaka (MY); Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 1188 days.

(21) Appl. No.: 12/020,821

(22) Filed: Jan. 28, 2008

(65) Prior Publication Data
US 2009/0189259 A1    Jul. 30, 2009

(51) Int. Cl.
*H01L 21/44*    (2006.01)
*H01L 21/48*    (2006.01)
*H01L 21/50*    (2006.01)

(52) U.S. Cl.
USPC ........... 438/123; 438/111; 438/121; 438/124; 257/E21.499; 257/E21.502

(58) Field of Classification Search
USPC .......... 438/111, 123, 121, 124; 257/666, 676, 257/E21.499, E21.502
See application file for complete search history.

(56) References Cited

U.S. PATENT DOCUMENTS

| | | | | |
|---|---|---|---|---|
| 6,479,744 B1 * | 11/2002 | Tsuzuki et al. | ............... | 136/256 |
| 6,677,669 B2 * | 1/2004 | Standing | ...................... | 257/685 |
| 7,271,470 B1 * | 9/2007 | Otremba | ....................... | 257/666 |
| 2003/0071344 A1 * | 4/2003 | Matsuzawa et al. | .......... | 257/692 |
| 2003/0168252 A1 * | 9/2003 | Schmid et al. | ................ | 174/260 |
| 2007/0145582 A1 * | 6/2007 | Otremba | ....................... | 257/728 |
| 2007/0166558 A1 * | 7/2007 | Berkei et al. | ................... | 428/457 |
| 2009/0121330 A1 * | 5/2009 | Cruz | ............................. | 257/676 |

FOREIGN PATENT DOCUMENTS

| | | |
|---|---|---|
| DE | 10249206 B3 | 7/2004 |
| DE | 102007019686 A1 | 11/2007 |
| DE | 10235797 A1 | 3/2010 |

* cited by examiner

*Primary Examiner* — Shouxiang Hu
(74) *Attorney, Agent, or Firm* — Dicke, Billig & Czaja, PLLC (57) ABSTRACT

An electronic device and method of manufacturing. One embodiment includes attaching a first semiconductor chip to a first metallic clip. The first semiconductor chip is placed over a leadframe after the attachment of the first semiconductor chip to the first metallic clip.

17 Claims, 7 Drawing Sheets

METHOD OF MANUFACTURING ELECTRONIC DEVICE ON LEADFRAME

BACKGROUND

This invention relates to an electronic device and a method of manufacturing thereof.

Electronic devices may include carriers on which semiconductor chips may be placed. Further, electronic devices may include electrically conductive devices, such as metallic clips, so as to provide electrical coupling between the components of the device.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Devices with semiconductor chips are described below. The semiconductor chips may be of extremely different types and may include, for example, integrated electrical or electro-optical circuits. The semiconductor chips may, for example, be configured as power semiconductor chips, such as power transistors, power diodes or IGBTs (Insulated Gate Bipolar Transistors). Furthermore, the semiconductor chips may include control circuits, microprocessors or microelectromechanical components. In one embodiment, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements in one embodiment on its two main surfaces, that is to say on its top side and bottom side. In one embodiment, power transistors, power diodes and IGBTs may have a vertical structure. By way of example, the source electrode and gate electrode of a power transistor and the anode electrode of a power diode may be situated on one main surface, while the drain electrode of the power transistor and the cathode electrode of the power diode are arranged on the other main surface. A power diode may be embodied in one embodiment as a Schottky diode. Furthermore, the devices described below may include integrated circuits to control the integrated circuits of other semiconductor chips, for example, the integrated circuits of power transistors or power diodes. The semiconductor chips need not be manufactured from specific semiconductor material, for example Si, SiC, SiGe, GaAs, and, furthermore, may contain inorganic and/or organic materials that are not semiconductors, such as for example insulators, plastics or metals. Moreover, the semiconductor chips may be packaged or unpackaged.

The semiconductor chips have electrodes (or contact pads) which allow electrical contact to be made with the integrated circuits included in the semiconductor chips. One or more metal layers may be applied to the electrodes of the semiconductor chips. The metal layers may be manufactured with any desired geometric shape and any desired material composition. The metal layers may, for example, be in the form of a layer covering an area. Any desired metal or metal alloy, for example aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

The semiconductor chips may be mounted on carriers. The carriers may be of any shape, size or material. During the fabrication of the devices the carrier may be provided in a way that other carriers are arranged in the vicinity and are connected by connection devices to the carrier with the purpose of separating the carriers. The carrier may be fabricated from metals or metal alloys, in one embodiment copper, copper alloys, iron nickel, aluminum, aluminum alloys, or other materials. It may further be electrically conductive. Furthermore, the carriers may be plated with an electrically conductive material, for example copper, silver, iron nickel or nickel phosphorus. The carrier may be, for example, a leadframe or a part of a leadframe, such as a die pad, or a metallic clip or any other rigid substrate. The carrier or a part of it may be bent, for example in an S-shaped manner. This may allow the carrier to connect two surfaces having different heights.

The semiconductor chips and the carriers, such as leadframes or metallic clips or other suitable substrates, may be joined by soldering. Soldering is a process in which two or more items, such as metal items, are joined together by melting and flowing a solder material into the joint. In order to solder the semiconductor chips to the carriers, solder material may be deposited on the semiconductor chips, in one embodiment one or more electrodes of the semiconductor chips, or on the carriers. If diffusion soldering is used as a connecting technique to connect the semiconductor chips to the carriers, solder materials are used which lead to intermetallic phases after the end of the soldering operation at the interface between the semiconductor chip and the carrier on account of interface diffusion processes. In this case, the use of AuSn, AgSn, CuSn, Sn, AuIn, AgIn, AuSi or CuIn solders is conceivable.

When using a soft soldering process to join the semiconductor chips and the carriers to each other, solder material remains at the interface between the semiconductor chip and the carrier after the soldering process has been finished.

If the semiconductor chips are adhesively bonded to the carriers, it is possible to use electrically conductive adhesives which may be based on filled or unfilled polyimides, epoxy resins, acrylate resins, silicone resins or mixtures thereof and which may be enriched with gold, silver, nickel or copper in order to produce electrical conductivity.

The devices may include a mold material covering at least parts of the components of the devices. The mold material may be any appropriate thermoplastic or thermosetting material. Various techniques may be employed to cover the components with the mold material, for example compression molding or injection molding.

Figure 1A:
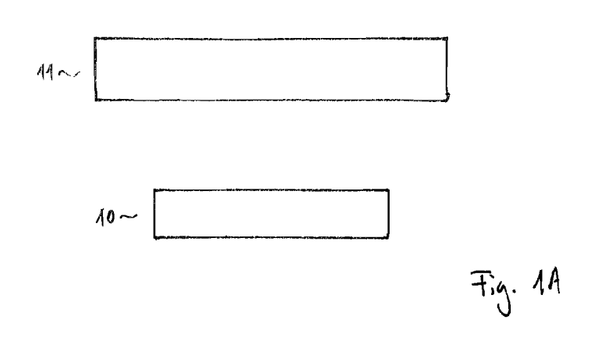
FIGS. 1A to 1C schematically illustrate one embodiment of a method to fabricate a device.
Figure 1B:
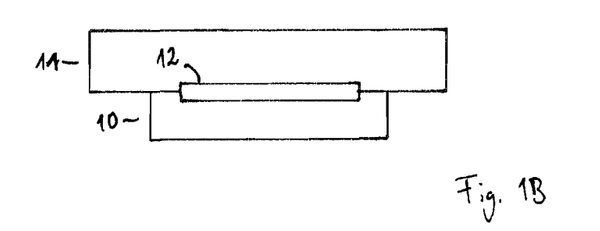
Figure 1C:
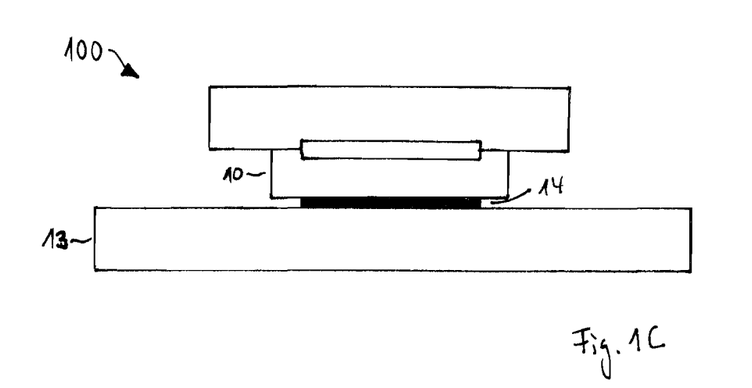

FIGS. 1A to 1C schematically illustrate a method for production of a device 100. A cross section of the device 100 obtained by the method is illustrated in FIG. 1C. Firstly, a first semiconductor chip 10 and a first metallic clip 11 are provided (see FIG. 1A). Then the semiconductor chip 10 is attached to the metallic clip 11 (see FIG. 1B). In case a diffusion soldering process is performed to attach the semiconductor chip 10 to the metallic clip 11, no solder material or only traces of solder material remain between the two components after finishing the soldering process. Instead, an intermetallic phase 12 is generated by the diffusion soldering process at the interface between the semiconductor chip 10 and the metallic clip 11. The diffusion soldering process may establish an electrical coupling between the semiconductor chip 10 and the metallic clip 11.

After the attachment of the semiconductor chip 10 to the metallic clip 11, the semiconductor chip 10 may be placed over a carrier 13, for example a leadframe or a die pad of the leadframe. The connection between the semiconductor chip 10 and the carrier 13 may be established by a soft soldering process or a gluing process which results in solder material 14 or adhesive material 14 remaining between the two components.

Figure 2A:
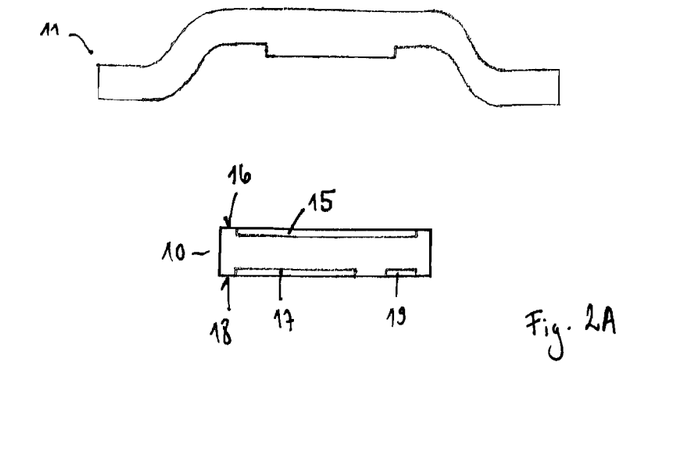
FIGS. 2A to 2E schematically illustrate one embodiment of a method to fabricate a device.
Figure 2B:
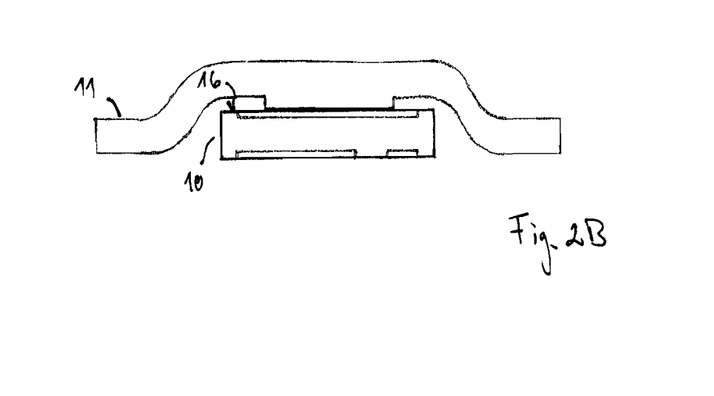
Figure 2C:
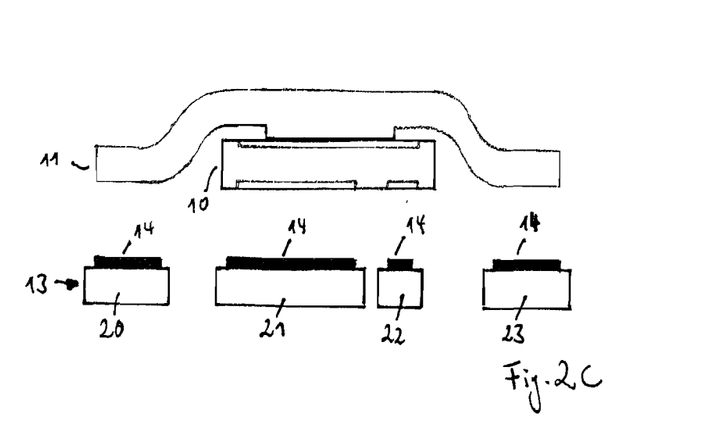
Figure 2D:
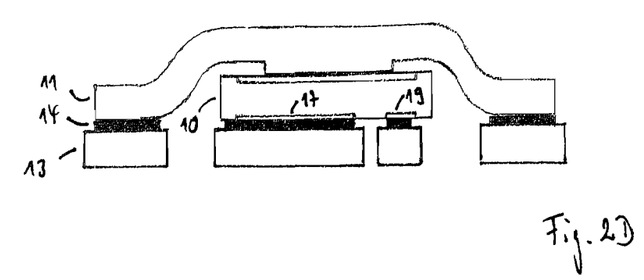
Figure 2E:
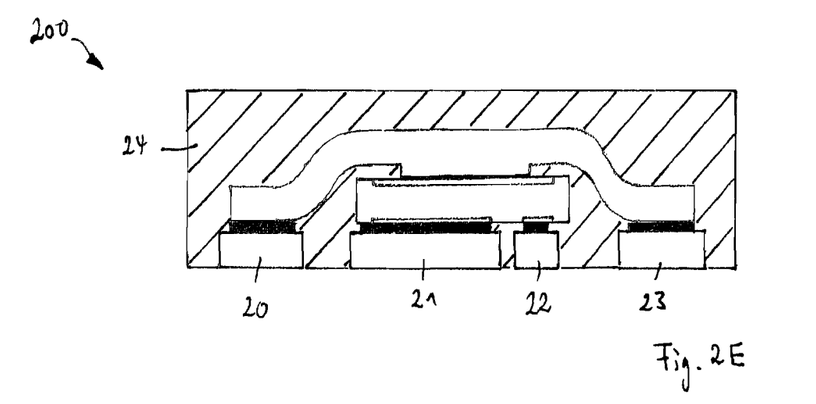

FIGS. 2A to 2E schematically illustrate a method for production of a device 200, a cross section of which is illustrated in FIG. 2E. The method illustrated in FIGS. 2A to 2E is a development of the method illustrated in FIGS. 1A to 1C. The details of the production method that are described below can therefore be likewise applied to the method of FIGS. 1A to 1C.

In FIG. 2A the semiconductor chip 10 and the metallic clip 11 are provided. The semiconductor chip 10 may have a first electrode 15 on a first main surface 16 and a second electrode 17 on a second main surface 18 that is opposite to the first main surface 16. The semiconductor chip 10 may, for example, be an IGBT (Insulated Gate Bipolar Transistor), a vertical power diode or a vertical power transistor, for example a power MOSFET. In the latter case, which is exemplarily illustrated in FIG. 2A, the first and second electrodes 15 and 17 may be drain and source electrodes, respectively. Furthermore, the semiconductor chip 10 may have a third electrode 19 on the second main surface 18 functioning as a gate electrode in the case the semiconductor chip 10 is a power transistor.

The metallic clip 11 may be manufactured from metals or metal alloys, in one embodiment copper, copper alloys, iron nickel, aluminum, aluminum alloys, or other electrically conductive materials. Furthermore, the metallic clip 11 may be plated with an electrically conductive material, for example copper, silver, iron nickel or nickel phosphorus. The metallic clip 11 may have one or more planar surfaces on which the components of the device 200 to be fabricated may be placed or which may be used to place the metallic clip 11 on the components. The shape of the metallic clip 11 is not limited to any size or geometric shape. The metallic clip 11 may be bent as exemplarily illustrated in FIG. 2A. A portion or several portions of the metallic clip 11 may be S-shaped. The metallic clip 11 may have a thickness in the range from 100 μm to 1 mm or may be even thicker. The metallic clip 11 may be fabricated by stamping, punching, pressing, cutting, sawing, milling or any other appropriate technique.

As illustrated in FIG. 2B, the semiconductor chip 10 is mounted onto the metallic clip 11 with its first main surface 16 facing the metallic clip 11. The drain electrodes 15 may be electrically coupled to the metallic clip 11 by diffusion soldering. For that, a solder material may be deposited on the drain electrode 15 or the lower surface of the metallic clip 11 (not illustrated), for example by sputtering or other appropriate physical or chemical deposition methods. The solder material may have a thickness in the range from 100 nm to 10 μm, in one embodiment in the range from 1 to 3 μm. The solder material may, for example, consist of AuSn, AgSn, CuSn, Sn, AuIn, AgIn, AuSi or CuIn.

For producing the soldered joint, the metallic clip 11 may be heated by a hot plate to a temperature above the melting point of the solder material, for example in the range from 200 to 400° C., in one embodiment in the range from 330 to 350° C. In one embodiment, both the semiconductor chip 10 and the metallic clip 11 may be placed in an oven and heated to an appropriate temperature. A pick-and-place tool may be used capable of picking the semiconductor chip 10 and placing it on the heated metallic clip 11 or vice versa. During the soldering process the semiconductor chip 10 may be pressed onto the metallic clip 11 for an appropriate time in the range between 10 and 200 ms, in one embodiment around 50 ms.

During the soldering process the solder material produces a metallic joint between the semiconductor chip 10 and the metallic clip 11 which is able to withstand high temperatures through the fact that the solder material forms a temperature-resistant and highly mechanically stable intermetallic phase with high-melting materials of the semiconductor chip 10 and the metallic clip 11 which are to be joined. The intermetallic phase has a higher melting temperature than the solder material used to generate the intermetallic phase. In the process, the low-melting solder material is completely transformed, i.e. it passes completely into the intermetallic phase. The process is diffusion-controlled and its duration increases as the thickness of the solder material layer rises.

Instead of using a single metallic clip 11, an integral array of metallic clips may be provided and a semiconductor chip may be mounted on each of the metallic clips. Later on in the manufacturing process, the individual devices may be separated by dividing the integral array of metallic clips.

As illustrated in FIG. 2C, the first semiconductor chip 10 together with the first metallic clip 11 are placed over the leadframe 13. A second semiconductor chip mounted on a second metallic clip in a similar manner as the first semiconductor chip 10 may also be placed over the leadframe 13 (not illustrated in FIG. 2C). Moreover, further semiconductor chips connected to further metallic clips may be placed over the leadframe 13 (not illustrated in FIG. 2C). The semiconductor chips may have been fabricated on a wafer made of semiconductor material. The semiconductor chips may have been manufactured on the same wafer, but may have been manufactured on different wafers. Furthermore, the semiconductor chips may be physically identical, but may also contain different integrated circuits.

The leadframe 13 may be manufactured from metals or metal alloys, in one embodiment copper, copper alloys, iron nickel, aluminum, aluminum alloys, or other electrically conductive materials. Furthermore, the leadframe 13 may be plated with an electrically conductive material, for example copper, silver, iron nickel or nickel phosphorus. The shape of the leadframe 13 is not limited to any size or geometric shape. The portion of the leadframe 13, over which the semiconductor chip 10 and the metallic clip 11 are placed, may include several pads 20, 21, 22 and 23, wherein the pads 20 and 23 may be embodied as a single pad. Each of the pads 20 to 23 may be coated with a layer of solder material 14. In one embodiment, the solder material 14 may be deposited on the semiconductor chip 10 and the metallic clip 11. The layers of the solder material 14 may have a thickness in the range between 10 and 30 µm. The solder material 14 may, for example, consist of AuSn, AgSn, CuSn, Sn, AuIn, AgIn, AuSi or CuIn.

A soft soldering process may be performed in order to join the semiconductor chip 10 and the metallic clip 11 to the leadframe 13. For that, the leadframe 13 and/or the semiconductor chip 10 as well as the metallic clip 11 may be heated to a temperature in the range from 200 to 400° C. and the semiconductor chip 10 and the metallic clip 11 may be placed on the leadframe 13. Due to the increased melting temperature of the intermetallic phase produced during the diffusion soldering process, the intermetallic phase between the semiconductor chip 10 and the metallic clip 11 is not melted during the soft soldering process. After the attachment, the metallic clip 11 may be attached to the pads 20 and 23 due to the S-shape of the metallic clip 11 (see FIG. 2D). The source and gate electrodes 17 and 19 of the semiconductor chip 10 are attached to the pads 21 and 22, respectively.

Instead of a soft soldering process, adhesive bonding by using an electrically conductive adhesive may be used to attach the semiconductor chip 10 and the metallic clip 11 to the leadframe 13. The electrically conductive adhesive may be based on filled or unfilled polyimides, epoxy resins, acrylate resins, silicone resins or mixtures thereof and may be enriched with gold, silver, nickel or copper in order to produce electrical conductivity.

If soft soldering or adhesive bonding are used as a connecting technique, a layer of the solder material 14 or the adhesive 14 remains at the interface between the semiconductor chip 10 and the leadframe 13 after the soldering or gluing process as illustrated in FIG. 2D. This layer may have a thickness in the range between 1 and 30 µm.

A mold transfer process may be carried out to encapsulate the components arranged on the leadframe 13 with a mold material 24 (see FIG. 2E). The mold material 24 may encapsulate any portion of the device 200, but leaves at least parts of the pads 20 to 23 uncovered. The exposed surfaces of the pads 20 to 23 may be used as external contact elements to electrically couple the device 200 to other components, for example a circuit board, such as a PCB (Printed Circuit Board).

The mold material 24 may be composed of any appropriate thermoplastic or thermosetting material, in one embodiment it may be composed of a material commonly used in contemporary semiconductor packaging technology. Various techniques may be employed to cover the components of the device 200 with the mold material 24, for example compression molding or injection molding.

Before or after the encapsulation with the mold material 24, the individual devices 200 are separated from one another by separation of the leadframe 13, for example by sawing.

Figure 3A:
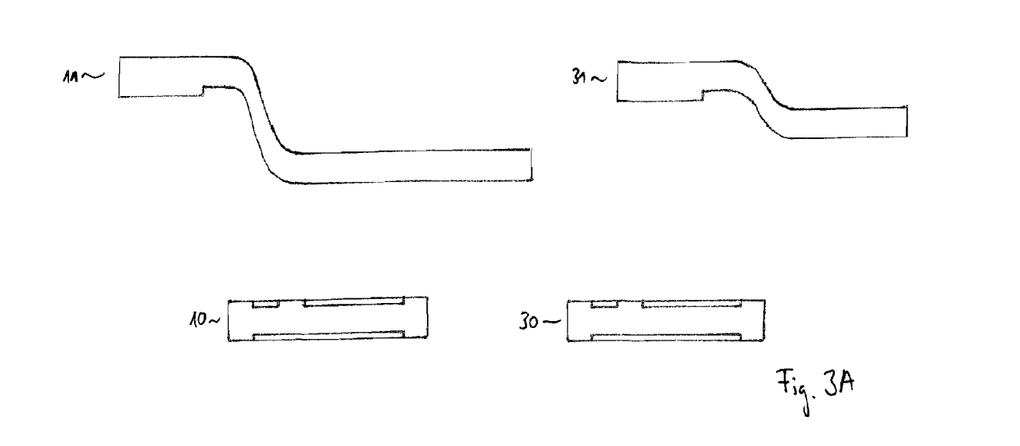
FIGS. 3A to 3G schematically illustrate one embodiment of a method to fabricate a device.
Figure 3B:
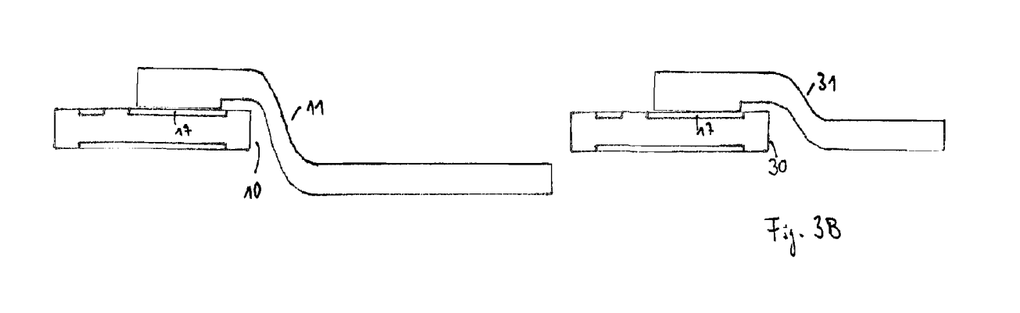
Figure 3C:
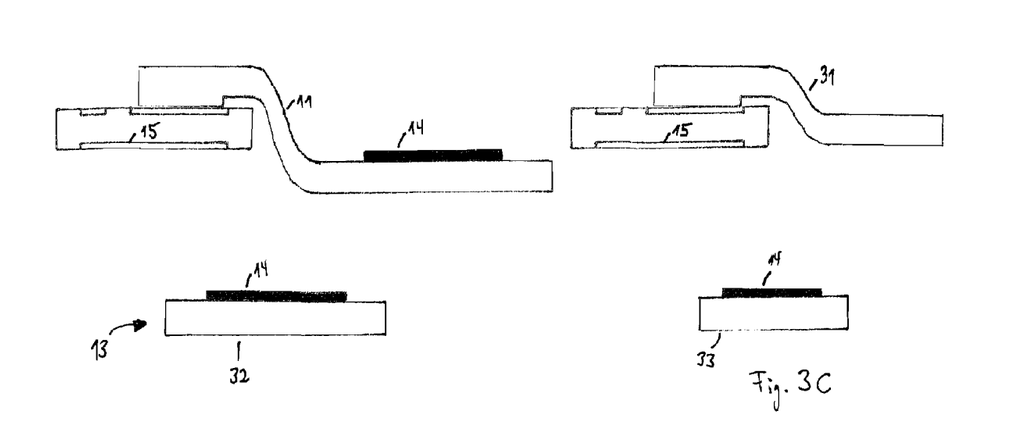
Figure 3D:
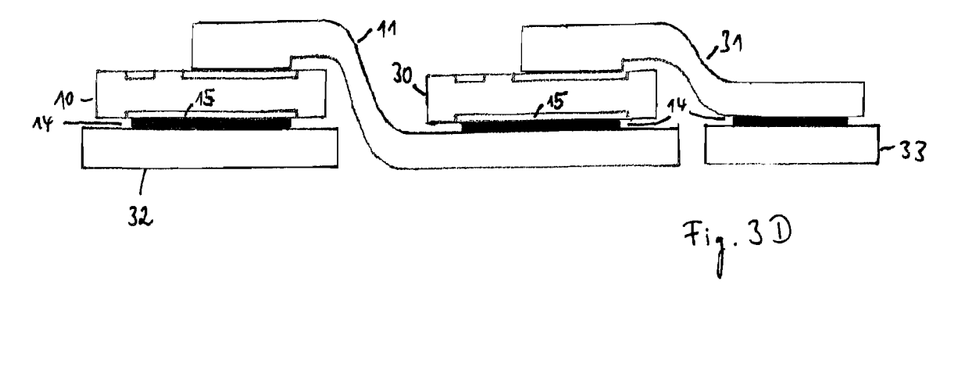
Figure 3E:
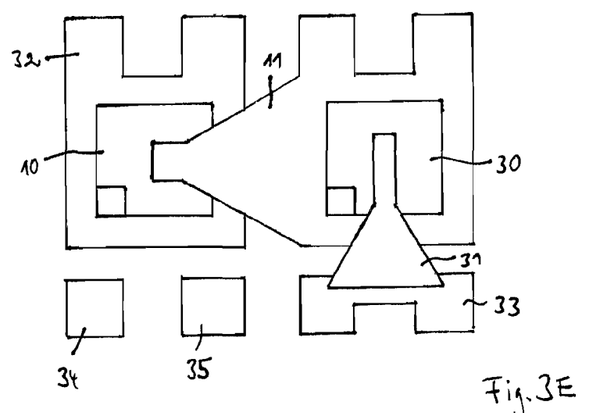
Figure 3F:
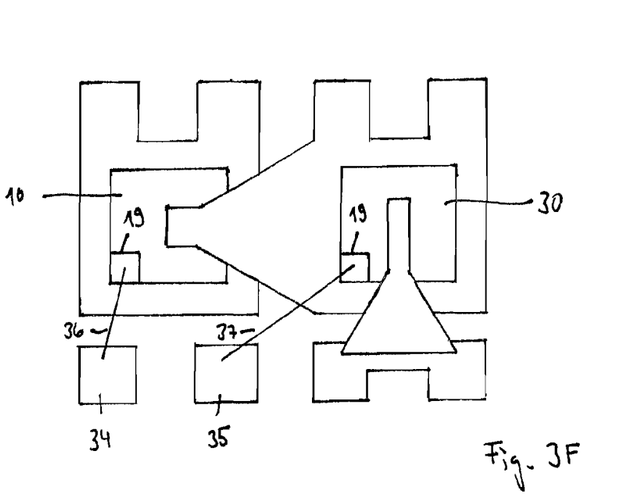
Figure 3G:
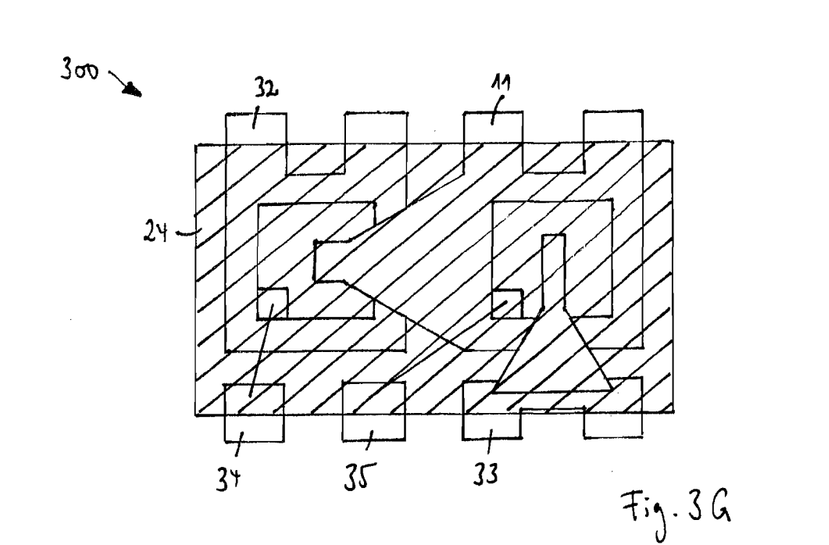

FIGS. 3A to 3G schematically illustrate a method for production of a device 300, a plan view of which is illustrated in FIG. 3G. The details of the production method that are described above in connection with FIGS. 2A to 2E can be likewise applied to the method of FIGS. 3A to 3G.

As illustrated in FIG. 3A, a first semiconductor chip 10, a second semiconductor chip 30, a first carrier 11 and a second carrier 31 are provided. In the present embodiment, both semiconductor chips 10 and 30 are power semiconductor chips, in one embodiment power transistors. Both carriers 11 and 31 may be implemented as metallic clips and may be S-shaped.

A first assembly may be produced by joining the first semiconductor chip 10 to the first metallic clip 11, and a second assembly may be produced by joining the second semiconductor chip 30 to the second metallic clip 31 (see FIG. 3B). The metallic clips 11 and 31 may be attached to the source electrodes 17 of the semiconductor chips 10 and 30, respectively. Both assemblies may be produced using a diffusion soldering process as described above in connection with FIG. 2B. The diffusion soldering process causes intermetallic phases between the semiconductor chips 10 and 30 as well as the respective metallic clips 11 and 31.

After the pre-assembly of the first and second assemblies, the first and second assemblies may be joined to each other and may also be joined to a third carrier. The third carrier may be a leadframe 13. In FIG. 3C, only two pads 32 and 33 of the leadframe 13 are illustrated. The first and second assemblies and the leadframe 13 may be joined by using a soft soldering process or a gluing process. Similarly as described above in connection with FIG. 2C, the pads 32 and 33 as well as the upper surface of the first metallic clip 11 may be at least partly coated with a layer of solder material 14 or electrically conductive adhesive 14. In one embodiment, the solder material 14 or electrically conductive adhesive 14 may be deposited on the drain electrodes 15 of the semiconductor chips 10 and 30 as well as the lower surface of the second metallic clip 31. The layers of the solder material 14 or the electrically conductive adhesive 14 may have a thickness in the range between 10 and 30 µm.

As illustrated in FIG. 3D, the first assembly, the second assembly and the leadframe 13 may be joined such that the drain electrode 15 of the first semiconductor chip 10 is electrically coupled to the pad 32, the drain electrode 15 of the second semiconductor chip 30 is electrically coupled to the first metallic clip 11, and the second metallic clip 31 is electrically coupled to the pad 33. Furthermore, the components may be joined such that the lower surfaces of the pads 32 and 33 and the first metallic clip 11 form a common plane. When a soft soldering or gluing process is used to join the pre-assembled components, solder material 14 or adhesive 14 remains at the soldering or gluing interfaces as illustrated in FIG. 3D.

In FIG. 3E, the assembly, which is illustrated in FIG. 3D in cross section, is illustrated in plan view. Here, the pad 33 and the second metallic clip 31 are rotated by 90°. In FIG. 3D, these components were arranged differently for better illustration.

In the top view, further pads 34 and 35 of the leadframe 13 are also illustrated. Bond wires 36 and 37 may be attached to electrically couple the drain electrodes 19 of the first and second semiconductor chips 10 and 30 to the pads 34 and 35, respectively (see FIG. 3F).

A mold transfer process may be carried out to encapsulate the components arranged on the leadframe 13 with a mold material 24 (see FIG. 3G). The mold material 24 may encapsulate any portion of the device 300, but leaves at least parts of the pads 32 to 35 and the first metallic clip 11 uncovered, for example their lower surfaces. The exposed surfaces of the pads 32 to 35 and the first metallic clip 11 may be used as external contact elements to electrically couple the device 300 to other components.

Before or after the encapsulation with the mold material 24, the individual devices 300 may be separated from one another by separation of the leadframe 13, for example by sawing.

Figure 4:
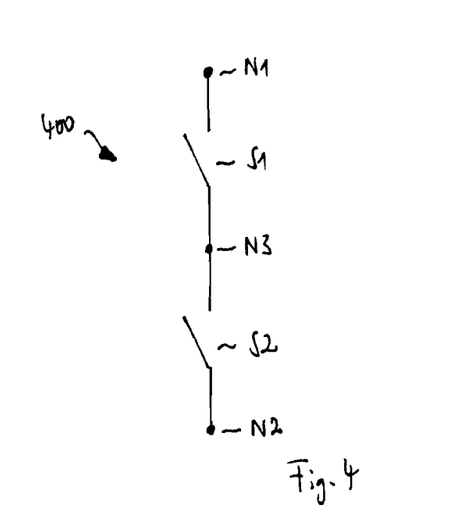
FIG. 4 illustrates a basic circuit of a half-bridge.

Having the connections as illustrated in FIG. 3G, the device 300 can be used as a half-bridge. A basic circuit of a half-bridge 400 arranged between two knots N1 and N2 is illustrated in FIG. 4. The half-bridge 400 consists of two switches S1 and S2 connected in series. The semiconductor chips 10 and 30 may be implemented as the two switches S1 and S2, respectively. When compared to the device 300 illustrated in FIG. 3G, the node N1 is the drain electrode 15 of the first semiconductor chip 10, the node N3 arranged between the two switches S1 and S2 is the drain electrode 15 of the second semiconductor chip 30 and the node N2 is the source electrode 17 of the second semiconductor chip 30.

The half-bridge 400 may, for example, be implemented in electronic circuits for converting DC voltages, in one embodiment DC-DC converters. DC-DC converters may be used to convert a DC input voltage provided by a battery or a rechargeable battery into a DC output voltage matched to the demand of electronic circuits connected downstream. DC-DC converters may be embodied as step-down converters, in which the output voltage is less than the input voltage, or as step-up converters, in which the output voltage is greater than the input voltage. Frequencies of several MHz or higher may be applied to DC-DC converters. Furthermore, currents of up to 50 A or even higher may flow through the DC-DC converters.

Figure 5A:
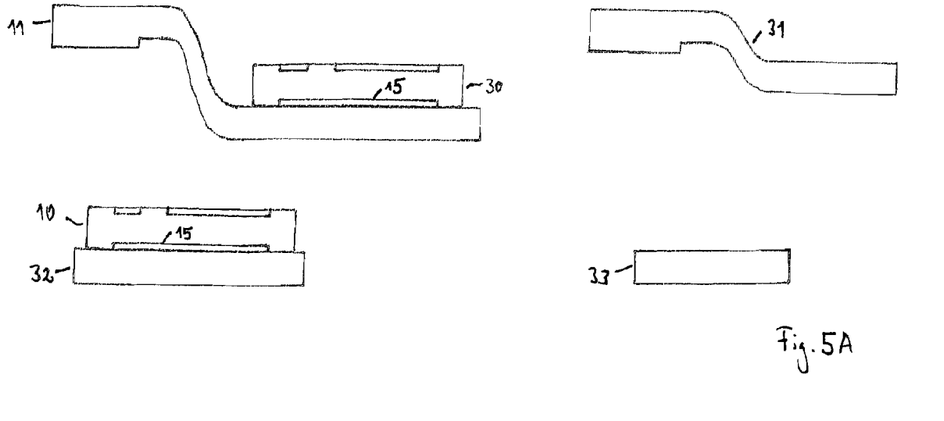
FIGS. 5A to 5C schematically illustrate one embodiment of a method to fabricate the device.
Figure 5B:
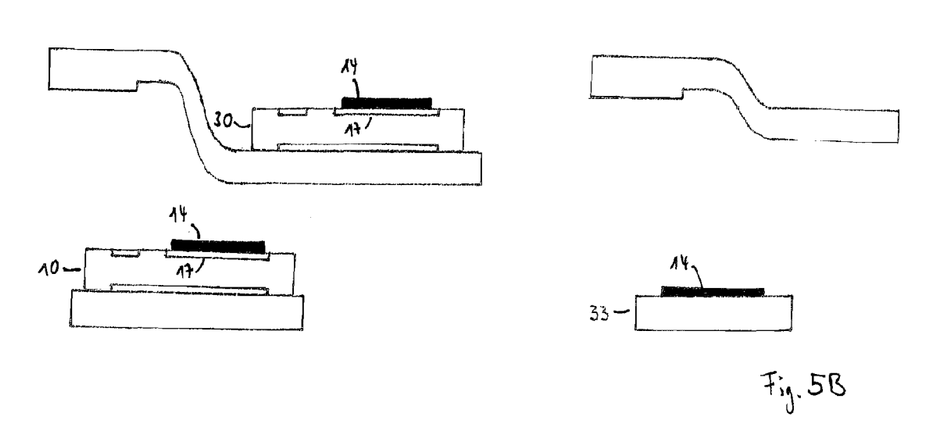
Figure 5C:
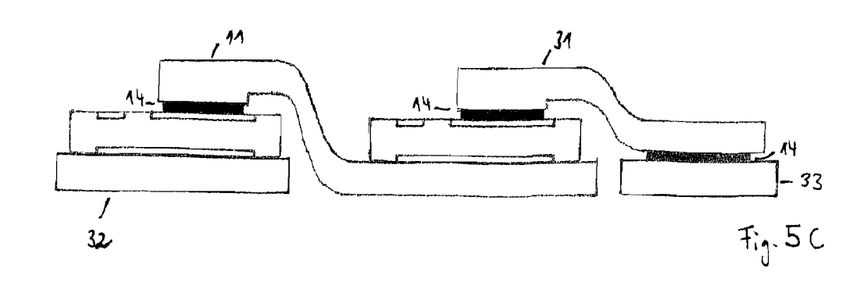

It is obvious to a person skilled in the art that the devices 100, 200 and 300 illustrated in FIGS. 1C, 2E and 3G are only intended to be exemplary embodiments, and many variations are possible. For example, the device 300 may be fabricated using a slightly different fabrication method which is illustrated in FIGS. 5A to 5C. According to this fabrication method, the first assembly is produced by diffusion soldering the drain electrode 15 of the first semiconductor chip 10 to the upper surface of the pad 32 (see FIG. 5A). The second assembly is produced by diffusion soldering the drain electrode 15 of the second semiconductor chip 30 to the upper surface of the first metallic clip 11.

The first and second assemblies and the second metallic clip 31 are then joined to each other by soft soldering or adhesive bonding. For that, a layer of solder material 14 or electrically conductive adhesive 14 is deposited on the source electrodes 17 of the semiconductor chips 10 and 30 and the pad 33 (see 5B). After the soft soldering process, a thin layer of solder material 14 remains at the soldering interfaces (see FIG. 5C).

Other variations of the fabrication method of the device 300 are also possible. These variations may include that assemblies are pre-assembled by diffusion soldering and the assemblies are then joined together by soft soldering or adhesive bonding.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming devices. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   providing a first metallic clip having an upper portion and a lower portion;
   providing a second metallic clip having an upper portion and a lower portion;
   attaching a first semiconductor chip to the upper portion of the first metallic clip;
   placing the first semiconductor chip over a leadframe after the attachment of the first semiconductor chip to the first metallic clip such that a lower surface of the lower portion of the first metallic clip is substantially co-planar with a lower surface of the leadframe;
   attaching a second semiconductor chip to the upper portion of the second metallic clip, wherein the second metallic clip is separate from the first metallic clip; and
   placing the second semiconductor chip over the lower portion of the first metallic clip and placing the lower portion of the second metallic clip over the leadframe after the attachment of the second semiconductor chip to the second metallic clip, wherein the first semiconductor chip and the second semiconductor chip are arranged side by side.

2. The method of claim 1, further comprising dicing the leadframe after the placement of the first and second semiconductor chips.

3. The method of claim 1, further comprising performing a diffusion soldering process to attach the first semiconductor chip to the first metallic clip.

4. The method of claim 1, wherein a soft soldering process or a gluing process is performed to attach the first semiconductor chip to the leadframe.

5. The method of claim 1, further comprising:
   attaching a first surface of the first semiconductor chip to the first metallic clip; and placing the first semiconductor chip over the leadframe with a second surface of the first semiconductor chip facing the leadframe.

6. The method of claim 5, wherein the first semiconductor chip has a first electrode on its first surface and a second electrode on its second surface.

7. The method of claim 1, wherein at least a portion of the first metallic clip is S-shaped.

8. A method, comprising:
providing a first carrier having an upper portion and a lower portion;
providing a second carrier having an upper portion and a lower portion;
producing a first assembly by joining a first semiconductor chip to the upper portion of the first carrier;
producing a second assembly separate from the first assembly by joining a second semiconductor chip to the upper portion of the second carrier; and
joining the first assembly and the second assembly to each other after producing the second assembly separate from the first assembly by joining the second semiconductor chip to the lower portion of the first carrier, wherein a lower surface of the second semiconductor chip and a lower surface of the lower portion of the second carrier define a common plane wherein the method further comprises joining a third carrier to the first and second assemblies such that a lower surface of the lower portion of the first carrier is substantially co-planar with a lower surface of the third carrier.

9. The method of claim 8, wherein the first and second carriers are metallic clips.

10. The method of claim 8, wherein the third carrier is a leadframe.

11. The method of claim 8, further comprising performing a diffusion soldering process to join the first semiconductor chip to the first carrier.

12. The method of claim 8, further comprising performing a soft soldering process or a gluing process to join the first and second assemblies to each other.

13. The method of claim 8, further comprising covering the first and second semiconductor chips with a mold material after joining the first and second assemblies to each other.

14. A method, comprising:
providing a first metallic clip having an upper portion and a lower portion;
providing a second metallic clip having an upper portion and a lower portion;
providing a first semiconductor chip having a first surface and a second surface opposite to the first surface;
providing a second semiconductor chip having a first surface and a second surface opposite to the first surface;
attaching the first surface of the first semiconductor chip to the upper portion of the first metallic clip by performing a diffusion soldering process;
attaching the first surface of the second semiconductor chip to the upper portion of the second metallic clip by performing a diffusion soldering process;
attaching the second surface of the first semiconductor chip to a carrier by performing a soft soldering process or a gluing process after the attachment of the first semiconductor chip to the first metallic clip such that a lower surface of the lower portion of the first metallic clip is substantially co-planar with a lower surface of the carrier;
attaching the second surface of the second semiconductor chip to the lower portion of the first metallic clip by performing a soft soldering process or a gluing process after the attachment of the second semiconductor chip to the second metallic clip; and
attaching the lower portion of the second metallic clip to the carrier by performing a soft soldering process or a gluing process after the attachment of the second semiconductor chip to the second metallic clip.

15. The method of claim 14, further comprising covering the first semiconductor chip with a mold material after the attachment of the first semiconductor chip to the carrier.

16. The method of claim 14, wherein the first semiconductor chip has a first electrode on its first surface and a second electrode on its second surface.

17. A method, comprising:
providing a first semiconductor chip having a first electrode on a first surface and a second electrode on a second surface opposite to the first surface;
providing a second semiconductor chip having a first electrode on a first surface and a second electrode on a second surface opposite to the first surface;
providing a first S-shaped metallic clip having a first end and a second end;
providing a second S-shaped metallic clip having a first end and a second end;
providing a leadframe comprising a first pad and a second pad;
providing a first assembly by joining the second electrode of the first semiconductor chip to the first end of the first S-shaped metallic clip;
producing a second assembly by joining the second electrode of the second semiconductor chip to the first end of the second S-shaped metallic clip; and
joining the first assembly and the second assembly to the leadframe after producing the second assembly and the first assembly by joining the first electrode of the first semiconductor chip to an upper surface of the first pad, joining the first electrode of the second semiconductor chip to a lower surface of the second end of the first S-shaped metallic clip, and joining the lower surface of the second end of the second S-shaped metallic clip to an upper surface of the second pad;
wherein a lower surface of the first pad, a lower surface of the second pad and a lower surface of the second end of the first S-shaped metallic clip form a common plane.

* * * * *

UNITED STATES PATENT AND TRADEMARK OFFICE
CERTIFICATE OF CORRECTION

| | | |
|---|---|---|
| PATENT NO. | : 8,642,394 B2 | Page 1 of 1 |
| APPLICATION NO. | : 12/020821 | |
| DATED | : February 4, 2014 | |
| INVENTOR(S) | : Mohamed et al. | |

It is certified that error appears in the above-identified patent and that said Letters Patent is hereby corrected as shown below:

In the Claims:

Column 10, line 9, delete "the first metallic clip" and insert in place thereof --the first metallic clip such that a lower surface of the lower portion of the first metallic clip is substantially co-planar with a lower surface of the carrier--.

Signed and Sealed this
Thirtieth Day of September, 2014

Michelle K. Lee
*Deputy Director of the United States Patent and Trademark Office*